United States Patent [19]
Fung et al.

[11] Patent Number: 5,184,129
[45] Date of Patent: Feb. 2, 1993

[54] SWITCHABLE DAC WITH CURRENT SURGE PROTECTION

[75] Inventors: Jimmy Fung, Cupertino; Jiu An, San Jose; David L. Campbell, Sunnyvale; Steven Shyu, Cupertino, all of Calif.

[73] Assignee: Advanced Micro Devices, Inc., Sunnyvale, Calif.

[21] Appl. No.: 712,146

[22] Filed: Jun. 6, 1991

Related U.S. Application Data
[63] Continuation of Ser. No. 407,447, Sep. 13, 1989.

[51] Int. Cl.$^5$ .............................................. H03M 1/66
[52] U.S. Cl. ..................................... 341/144; 341/136
[58] Field of Search ............... 341/144, 154, 153, 118, 341/126, 133, 136, 147

[56] References Cited
U.S. PATENT DOCUMENTS

| | | | |
|---|---|---|---|
| 4,521,765 | 6/1985 | Wang et al. | 341/154 |
| 4,712,091 | 12/1987 | Schoofs et al. | 341/144 X |
| 4,716,398 | 12/1987 | Eccleston et al. | 341/118 |
| 4,716,463 | 12/1987 | Stacy et al. | 358/190 |
| 4,766,415 | 8/1988 | Dielacher | 341/144 X |
| 4,831,282 | 5/1989 | Colles | 307/443 |
| 4,839,530 | 6/1989 | Greenwood | 307/10.1 |
| 4,926,064 | 5/1990 | Tapang | 307/201 |
| 5,023,614 | 6/1991 | Fung et al. | 341/144 |

Primary Examiner—Sharon D. Logan
Attorney, Agent, or Firm—Fliesler, Dubb, Meyer & Lovejoy

[57] ABSTRACT

In a CMOS DAC having a plurality of stages a control circuit for selectively switching said DAC between a sleep mode and a normal operating mode with little, if any, surge current resulting therefrom. In the control circuit there is provided control transistors responsive to control signals for applying a reverse biasing potential to a reference voltage transistor and a digital input transistor in each of the stages at a rate such that the rate of change of current in the reference voltage transistor is less than a predetermined magnitude, e.g. less than 5 ma/nsec. when said DAC is switched to its sleep mode and transistor means responsive to control signals for first applying a predetermined forward biasing potential to a bias transistor and thereafter changing said reverse potential applied to said reference voltage transistor to a predetermined reference voltage and removing said reverse bias potential from said digital input transistor when said DAC is switched to its normal operating mode.

10 Claims, 2 Drawing Sheets

SWITCHABLE DAC WITH CURRENT SURGE PROTECTION

This application is a continuation of Ser. No. 07/407,447, filed Sep. 13, 1989.

BACKGROUND OF THE INVENTION

1. Field of the Invention

The present invention relates to digital-to-analog converters (DACs) in general and in particular to DACs which can be switched between a sleep mode and a normal operating mode in high speed, e.g. 100 mHz, video graphics systems employing pipeline architecture with little, if any, surge current resulting therefrom.

2. Description of the Prior Art

A conventional color video graphics system, e.g. color palette, comprises three DACs for driving the red, green and blue analog inputs of a typical color monitor. Each of the DACs may comprise as many as 400 stages depending on the desired resolution of the DAC. Using conventional CMOS technology, each stage typically comprises three CMOS field-effect (FET) transistors, e.g. a bias transistor, a reference voltage transistor and a digital input transistor.

In normal operation, a current flows in each of the stages of a conventional CMOS DAC at all times, even when the DAC is not being used. The power thus consumed is a serious impediment to the use of such DACs in battery powered video graphics systems, such as lap top computers.

SUMMARY OF THE INVENTION

In view of the foregoing, principal objects of the present invention are a method and apparatus for selectively switching each stage of a CMOS DAC between sleep and normal operating modes with no appreciable current surge in the stage so as to minimize power utilization when the DACs are not used.

In accordance with the above objects, additional CMOS transistor circuits are coupled to the gates of the normally used CMOS transistors in each stage of the DAC for controlling the conduction of the normally used transistors.

In operation, the control of the additional transistors, i.e. control transistors, is such that during the sleep mode, i.e. when current in the DAC stage is terminated, the reference voltage transistor and the normal digital input voltage transistor which are operable as a differential pair are reverse biased, i.e. driven to a non-conducting state at a rate which limits the rate of change of current in the reference voltage transistor to less than 5 ma/sec. This allows the potential on the gates of the normal current source transistor to vary widely without causing a current to flow in the stage. When normal operation of the DAC is to be restored, the control transistors are operated in such a manner that the potential on the gate of the current source transistor is first driven to a level which is at or near the normal bias potential applied to the gate of the current source transistor. Thereafter, and while the bias on the current source transistor is returning to its normal operating potential, a normal reference voltage is applied to bias the reference voltage transistor and the reverse bias applied to the digital input transistor in the sleep mode is removed. In this manner, high surge currents, which could occur if the bias transistor was heavily forward biased when the DAC stages are switched to their normal operating mode, are prevented.

By providing for the selective operation of CMOS DACs as described herein, the use of high speed DAC circuits heretofore restricted to desk top color palettes, and the like, can now be extended to battery powered lap top computers and the like.

BRIEF DESCRIPTION OF THE DRAWINGS

The above and other objects, features and advantages of the present invention will become apparent from the following detailed description of the accompanying drawings, in which.

DETAILED DESCRIPTION OF THE INVENTION

Figure 1:
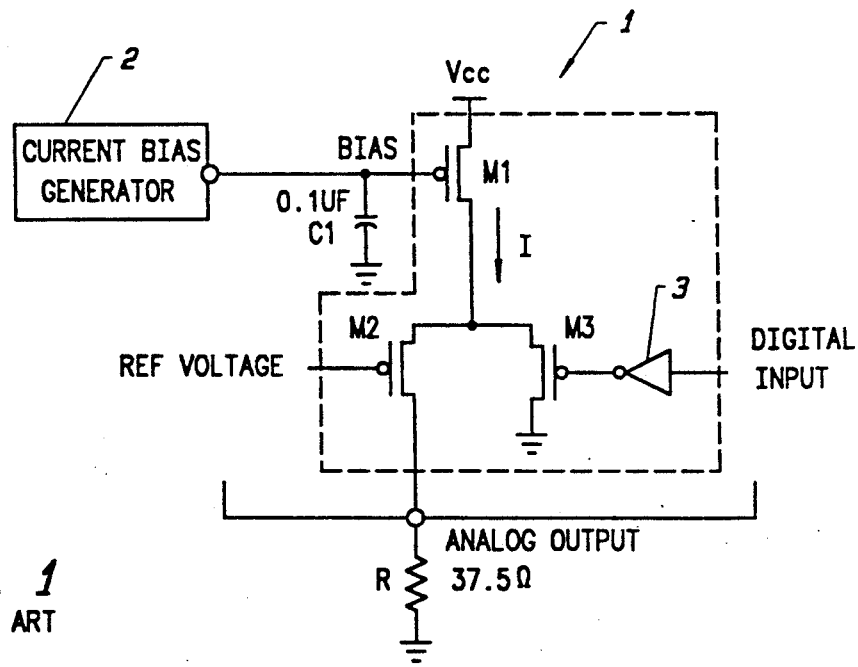
FIG. 1 is a schematic diagram of one stage of a multiple stage prior known DAC.

Referring to FIG. 1, there is shown a single stage, designated generally as 1, of a conventional multi-stage DAC. The stage 1 comprises a CMOS current source transistor M1, a CMOS reference voltage transistor M2 and a CMOS digital input voltage transistor M3. Transistor M1 is coupled in series with transistors M2 and M3 which are coupled in in a manner allowing them to be operable as a differential pair a 37.5 ohm resistor R is coupled between transistor M2 and ground. The gate of current source transistor M1 is coupled to a current bias generator 2 and to ground through a 0.1 microfarad capacitor C1. The gate of reference voltage transistor M2 is coupled to a source of reference voltage. The gate of digital input voltage transistor M3 is coupled to a source of digital input signals by means of an inverter 3.

A conventional DAC may comprise as many as 400 stages of the type shown in FIG. 1. Each of the stages are coupled in parallel to the current bias generator 2, source of reference voltage applied to the gate of M2, and the resistor R for generating a potential across the resistor R which depends on the digital input signals applied to the transistor M3 in the individual stages.

In normal operation, current source transistor M1 is coupled to a source of supply voltage Vcc, e.g. +5 volts, and forward biased by current bias generator 2. A reference voltage, e.g. +1.2 volts, is applied to the gate of reference voltage transistor M2. When M3 is reverse biased as by a high potential, e.g. Vcc, applied to its gate as a result of a digital input signal applied to the input of the inverter 3, transistor M2 will be forward biased allowing a current I to flow through transistor M2 and the resistor R causing a predetermined voltage drop across the resistor R. On the other hand, when the digital input signal applied to the gate of transistor M3 is such as to forward bias transistor M3, transistor M2 will be reverse biased and the current I flowing through M1 will be diverted through the transistor M3 thus reducing the voltage drop across the resistor R. Since all of the stages of a DAC are coupled in parallel to resistor R, the magnitude of the current through resistor R and the resulting voltage drop across resistor R will be a direct measure of the number of stages in which transistors M2 and M3 are conducting, thus providing an analog signal corresponding to the magnitude of the digital signal applied to the stages in the DAC.

In typical color palettes, DACs are used to drive the standard EIA RS343A video interface which interfaces a graphics controller and a video monitor. Typically, three DACs are included in each color palette, with each DAC comprising approximately 400 stages as described above. A typical color palette therefore comprises a total of 1200 DAC stages requiring approximately 100 milliamperes of current. Such high current requirements are a serious disadvantage in conventional battery powered lap top computers. It is, therefore, very advantageous to provide DACs in lap top computers which can be switched between a sleep mode when they are not being used and a normal operating mode when they are required in order to conserve battery power.

Figure 2:
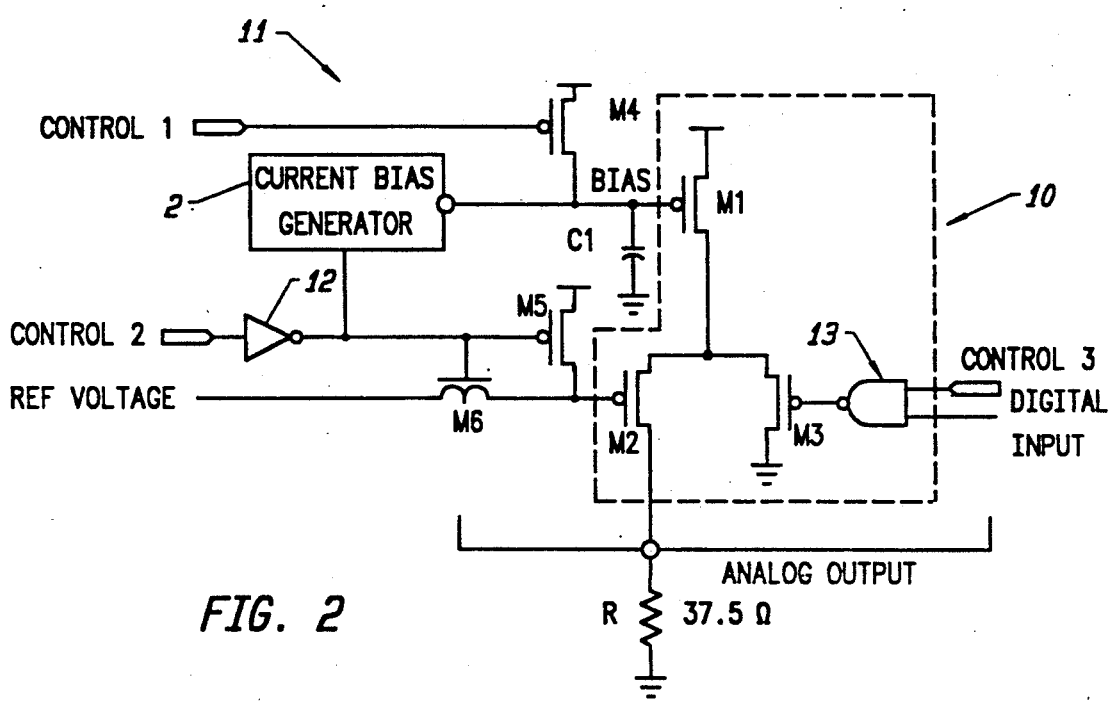
FIG. 2 is a schematic diagram of one stage of a multiple stage DAC with a switching circuit for switching the stage between a sleep mode and a normal operating mode according to the present invention.

Referring to FIG. 2, there is provided in accordance with the present invention one stage designated generally as 10, comprising the transistors M1, M2 and M3, the capacitor C1 and the resistor R described above with respect to the apparatus of FIG. 1 and a control circuit designated generally as 11 which is coupled to all of the stages in the DAC for switching the stages between a sleep mode and a normal operating mode, as will be further described below.

In the stage 10, the gate of the current source transistor M1 is coupled to ground through the capacitor C1, to the voltage supply Vcc, through a control transistor M4 and to current bias generator 2. The gate of transistor M4 is coupled to a source of a control signal, control 1. The gate of reference voltage transistor M2 is coupled to the source of supply voltage Vcc by means of a control transistor M5 and to a source of reference voltage by means of a control transistor M6. The gates of the control transistors M5 and M6 are coupled through an inverter 12 to a source of a second control signal, control 2. The output of the inverter 12 is also coupled to the current bias generator 2 for selectively turning the current bias generator 2 on and off, as will be described below.

The transistors M5 and M6 are specially constructed to control the rate at which the supply potential Vcc and the reference voltage are applied to the gate of M2. For example, in a typical embodiment of the present invention, transistor M5 has a length and width comprising approximately 10 microns, respectively. The transistor M6 has a length and width comprising 2.0 and 372 microns, respectively. As is well known in the fabrication of CMOS transistors, current flow for a given bias voltage is directly proportional to the width of the transistor and inversely proportional to the length of the transistor such that for a given bias potential and width, current flow decreases with increasing length and for a given bias potential and length, current flow increases with increasing width. By thus controlling the current flow through the transistors M5 and M6, the rate at which the potential changes on the gate of transistor M2 can be controlled. In the present invention, the characteristics of transistor M5 are such that when M5 reverse biases transistor M2, the rate of change of decreasing current in M2 is restricted to a predetermined magnitude, e.g. less than 5 ma/nsec, while the characteristics of transistor M6 are such that when M6 is forward biased, the full reference voltage is applied rapidly to the gate of M2. Of course, the actual time it takes to charge the gate M2 depends on the capacitive load coupled thereto due to the other stages coupled in parallel therewith.

The gate of M3 is coupled to the output of a two-input NAND gate 13. A first input of the NAND gate 13 is coupled to a source of a third control signal, control 3. A second input of the NAND gate 13 is coupled to a source of digital input signals as described above with respect to the apparatus of FIG. 1.

Figure 3:
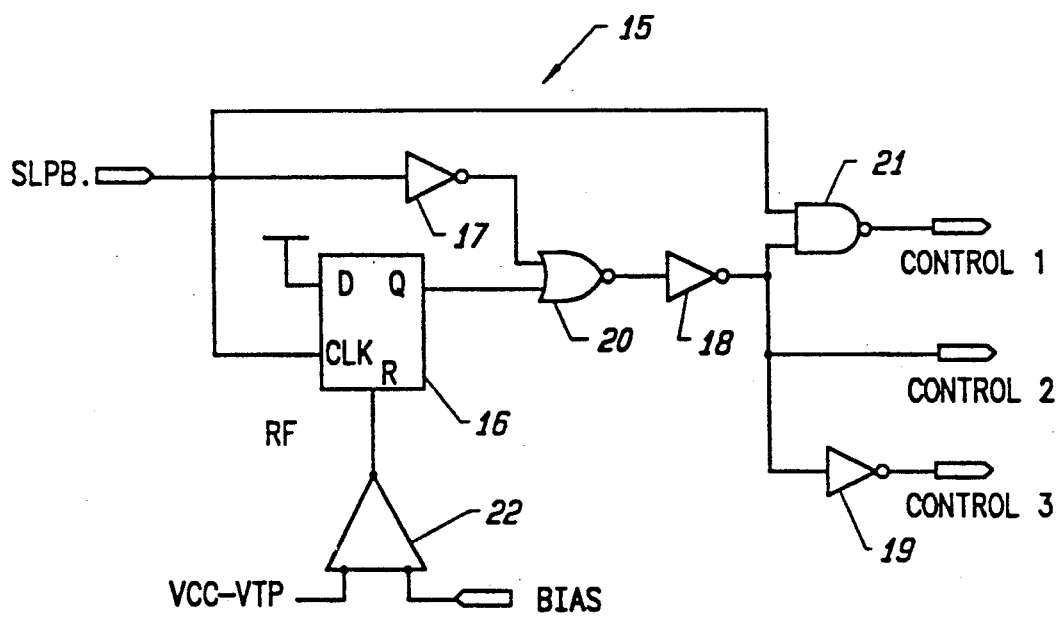
FIG. 3 is a block diagram of a circuit for generating the control signals used for controlling the switching circuit of FIG. 2.

Referring to FIG. 3, there is further provided in accordance with the present invention a sequence control circuit designated generally as 15 for generating the control signals, control 1, control 2 and control 3. In the circuit 15 there is provided a flip-flop 16, a plurality of inverters 17, 18 and 19, a NOR gate 20, a NAND gate 21 and a voltage comparator 22. In the flip-flop 16 there is provided a reset input R, a clock input CLK, a D-input D and a true output Q. Input D is coupled to the supply voltage Vcc. A source of a control signal SLPB is coupled to the clock input CLK, an input of the inverter 17 and a first input of the NAND gate 21. The output of the inverter 17 is coupled to a first input of the NOR gate 20. The output Q of the flip-flop 16 is coupled to a second input of the NOR gate 20. The reset input of the flip-flop 16 is coupled to the output of the converter 22. A first input of the converter 22 is coupled to a source of a reference voltage Vcc-Vtp. A second input of the comparator 22 is coupled to the gate of the transistor M1. The output of the NOR gate 20 is coupled to an input of the inverter 18. The output of the inverter 18 is coupled to a second input of the NAND gate 21 and an input of the inverter 19. The control signals, control 1, control 2 and control 3, are provided on the output of the NAND gate 21, the inverter 18 and the inverter 19, respectively.

Each of the stages of a DAC made in accordance with the present invention has two modes of operation; a sleep mode and a normal operating mode.

Figure 4:
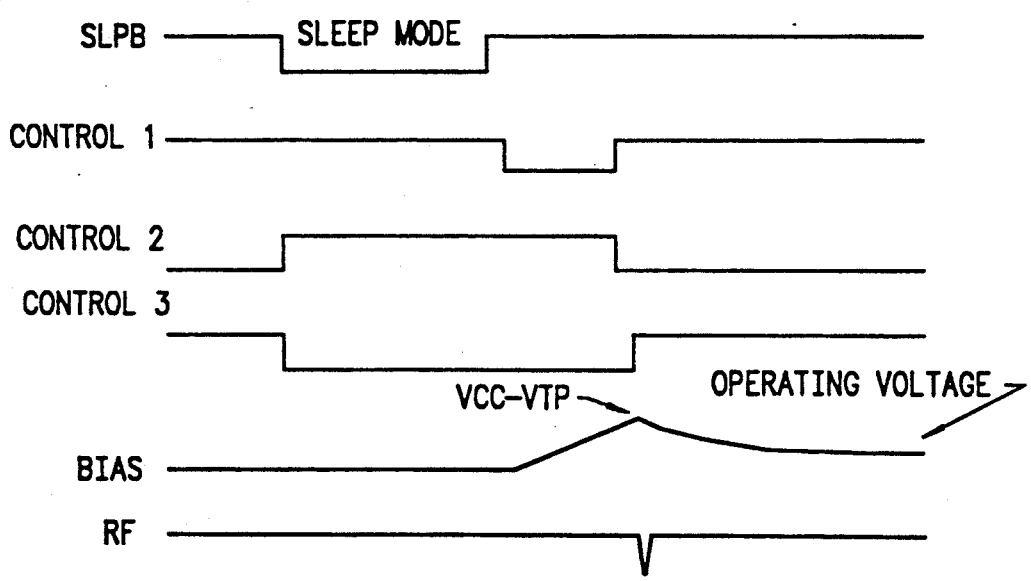
FIG. 4 is a timing diagram showing the timing of the control signals generated by the apparatus of FIG. 3.

Referring to FIGS. 2, 3 and 4, in operation, to cause each of the DAC stages to change from its normal operating mode to its sleep mode, control signal SLPB is driven low. When SLPB is driven low, the output of NAND gate 21, i.e. control 1, remains in its normal operating mode high state, the output of NOR gate 20 goes low causing the output of inverter 18, i.e. control 2, to go high and the output of inverter 19, i.e. control 3, to go low. With control 1 high, M4 is reverse biased and normal bias from generator 2 is applied to the gate of M1. When control 2 goes high, current bias generator 2 is deactivated, M5 is forward biased, M6 is reverse biased and the gate of M2 is pulled toward Vcc at a slow rate, reverse biasing M2. The design of M5, as described above, is such that the rate at which M2 is reverse biased, i.e. the rate at which the gate of M2 is pulled toward Vcc, is such that the rate of change of current in M2 is less than 5 ma/nsec. When control 3 goes low, the output of the NAND gate 13 goes high, reverse biasing M3. When M2 and M3 are reverse biased no current will flow in the DAC stages regardless of the potential on the gate of M1, thus the DAC stages are placed in their sleep mode.

To cause each of the DAC stages to enter its normal operating mode, signal SLPB is driven high. When SLPB is driven high, the Q output of the flip-flop goes high, control 1 goes low, control 2 stays high and control 3 stays low. When control 1 goes low, M4 is forward biased, applying Vcc to the capacitor C1 coupled to the gate of M1, thus charging the capacitor C1 and pulling the gate of M1 toward Vcc. When the potential, i.e. bias, on the gate of M1 exceeds the reference potential Vcc-Vtp on the comparator 22, where Vtp is the P-channel threshold potential, e.g. 0.7 volt, the output RF of the comparator 22 goes low, resetting the flip-flop 16 causing the Q output thereof to go low. When the Q output goes low, control 2 goes low and control 3 goes high. When control 2 goes low, current bias generator 2 is activated, applying a normal operating bias voltage to the gate of M1, M5 is reverse biased and M6 is forward biased, applying the reference voltage to the gate of M2. When control 3 goes high, the NAND gate is enabled to pass the digital input signals to M3. Because the bias potential on the gate of M1 is approximately at the normal operating level when M2 and M3 are enabled, i.e. when the DAC stage is turned on, little if any surge current will be generated.

While a preferred embodiment of the present invention is described above, it is contemplated that various modifications may be made thereto without departing from the spirit and scope of the present invention. For example, transistors M1-M5 are described as comprising P-channel devices and M6 is described as comprising an N-channel device. In suitable applications, the conductivity of these devices can be reversed with appropriate changes being made to the control signals controlling the devices. Accordingly, it is intended that the embodiment described be considered only as an illustration of the present invention and that the scope thereof should not be limited thereto but be determined by reference to the claims hereinafter provided and their equivalents.

What is claimed is:

1. In a digital-to-analog converter (DAC) having a plurality of stages, each of said stages having a current source coupled to a first and a second transistor which are operable as a differential pair, an apparatus for selectively switching said DAC between a normal operating mode and a sleep mode comprising:
   means for providing a signal for switching said DAC between the DAC's normal operating mode and the DAC's sleep mode;
   means for applying a potential to said first and said second transistors so as to render both of said first and said second transistors nonconductive when said DAC is switched from the DAC's normal operating mode to the DAC's sleep mode; and
   means responsive to said signal providing means for allowing current to flow from said current source through at least one of said first and second transistors when said DAC is switched from the DAC's sleep mode the DAC's normal operating mode.

2. An apparatus according to claim 1 wherein said potential applied to said first and said second transistors so as to render both said first and said second transistors nonconductive comprises a potential which renders said first and said second transistors nonconductive regardless of the potential applied to said current source transistor.

3. An apparatus according to claim 2 wherein said current source and said first and said second transistors are each CMOS transistors.

4. In a digital-to-analog converter (DAC) having a plurality of stages, each of said stages having a current source coupled to a first and a second transistor which are operable as a differential pair, a method of operating said DAC in a normal operating mode and in a sleep mode comprising the steps of:
   applying a potential to said first and said second transistors so as to render both of said first and said second transistors nonconductive when said DAC is operated in the sleep mode; and
   allowing current to flow from said current source through at least one of said first and second transistors when said DAC is operated in the DAC's normal operating mode.

5. A method according to claim 4 wherein said step of applying a potential to said first and said second transistors so as to render both said first and said second transistors nonconductive comprises the step of applying a potential to said first and said second transistors which renders said first and said second transistors nonconductive regardless of the potential applied to said current source transistor.

6. In a digital-to-analog converter (DAC) having a plurality of stages, each of said stages having a current source coupled to a reference voltage transistor and a data input transistor which are operable as a differential pair, an apparatus for selectively switching said DAC between a normal operating mode and a sleep mode comprising:
   means for coupling the data input transistor to a source of data; and
   means coupled to said current source and said reference voltage transistor which is responsive to a control signal for switching said DAC to its normal operating mode when said control signal is at a first logical level and for switching said DAC to the DAC's sleep mode when said control signal is at a second logical level.

7. In a digital-to-analog converter (DAC) having a plurality of stages, each of said stages having a current source coupled to a reference voltage transistor and a data input transistor which are operable as a differential pair, an apparatus for selectively switching said DAC between a normal operating mode and a sleep mode comprising:
   means for providing a bias voltage to the gate of said current source transistor and a reference voltage to the gate of said reference voltage transistor when said DAC is switched to the DAC's normal operating mode; and
   means for removing said bias voltage from the gate of said current source transistor and said reference voltage from the gate of said reference voltage transistor when said DAC is switched to the DAC's sleep mode.

8. An apparatus according to claim 7 comprising means for providing a reverse biasing potential on said gate of said reference voltage transistor after the reference voltage is removed therefrom when said DAC is switched to the DAC's sleep mode.

9. A digital-to-analog converter (DAC) having a plurality of stages, each of said stages having a current source MOS transistor coupled to a reference voltage MOS transistor and a data input MOS transistor, said DAC having a normal operating mode and a sleep mode, comprising:
   a source of bias potential;
   means for providing bias potential from the source of bias potential on the gate of the current source MOS transistor when the DAC is in the DAC's normal operating mode;
   MOS transistor means for coupling the gate of the reference voltage MOS transistor to a source of reference voltage;

means coupled to the gate of said MOS transistor means for providing a reference voltage on the gate of the reference voltage MOS transistor from the source of reference voltage when said DAC is in the DAC's normal operating mode;

means for deactivating the source of bias potential so as to remove the bias potential from the gate of the current source MOS transistor when the DAC is in the DAC's sleep mode; and means coupled to the gate of the MOS transistor means for removing the reference voltage from the gate of the reference voltage MOS transistor when said DAC is in the DAC's sleep mode.

10. An apparatus according to claim 9 comprising means for providing a reverse biasing potential on said gate of said reference voltage transistor after the reference voltage is removed therefrom when said DAC is switched to the DAC's sleep mode.

* * * * *